US008895338B2

(12) United States Patent
Huff

(10) Patent No.: US 8,895,338 B2
(45) Date of Patent: Nov. 25, 2014

(54) METHOD OF FABRICATING MEMS, NEMS, PHOTONIC, MICRO- AND NANO-FABRICATED DEVICES AND SYSTEMS

(75) Inventor: Michael A. Huff, Oakton, VA (US)

(73) Assignee: Corporation for National Research Initiatives, Reston, VA (US)

(*) Notice: Subject to any disclaimer, the term of this patent is extended or adjusted under 35 U.S.C. 154(b) by 373 days.

(21) Appl. No.: 13/074,487

(22) Filed: Mar. 29, 2011

(65) Prior Publication Data

US 2011/0250706 A1    Oct. 13, 2011

Related U.S. Application Data

(60) Provisional application No. 61/318,516, filed on Mar. 29, 2010.

(51) Int. Cl.
  *H01L 21/00* (2006.01)
  *B81C 99/00* (2010.01)
(52) U.S. Cl.
  CPC .................................. *B81C 99/006* (2013.01)
  USPC .............................................. 438/50; 438/53

(58) Field of Classification Search
  USPC ....................................................... 438/50–53
  See application file for complete search history.

(56) References Cited

PUBLICATIONS

Hahn et al., "Process management and deisgn for MEMS and microelectronics technologies", Microelectronics: Design, Technology, and Packaging, Proceedings of SPIE, 2004.*

* cited by examiner

*Primary Examiner* — Richard Booth
(74) *Attorney, Agent, or Firm* — Nixon & Vanderhye P.C.

(57) ABSTRACT

An improved method for the fabrication of Micro-Electro-Mechanical Systems (MEMS), Nano-Electro-Mechanical Systems (NEMS), Photonics, Nanotechnology, 3-Dimensional Integration, Micro- and Nano-Fabricated Devices and Systems for both rapid prototyping development and manufacturing is disclosed. The method includes providing a plurality of different standardized and repeatable process modules usable in fabricating the devices and systems, defining a process sequence for fabricating a predefined one of the devices or systems, and identifying a series of the process modules that are usable in performing the defined process sequence and thus in fabricating the predefined device or system.

53 Claims, 13 Drawing Sheets

| Application Area | Application Area | Integrated with Microelectronics | Estimated Time to Develop | Estimated Cost to Develop |
|---|---|---|---|---|
| Automotive Crash Airbags | Automotive Crash Airbags | Yes | 12+ | $500M |
| Displays | Displays | Yes | 15+ | $1B |
| Printers | Printers | Initially No | 12+ | >$300M* |
| Acoustics | Acoustics | No | 12+ | >$50M |
| Communication Filters | Communication Filters | No | 12+ | unknown |
| Timing | Timing | No | 10+ | >$65M |
| Infrared Focal Plane Array | Infrared Focal Plane Array | Yes | 15+ | >$200M |
| Inertial Sensing | Inertial Sensing | No | 12+ | >$50M |
| Acoustics | Acoustics | Yes | 7+ | unknown |
| Displays | Displays | No | 12+ | unknown |

FIG. 1

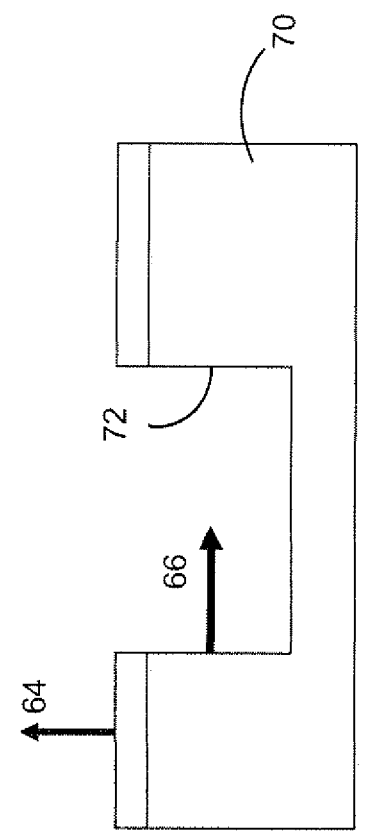
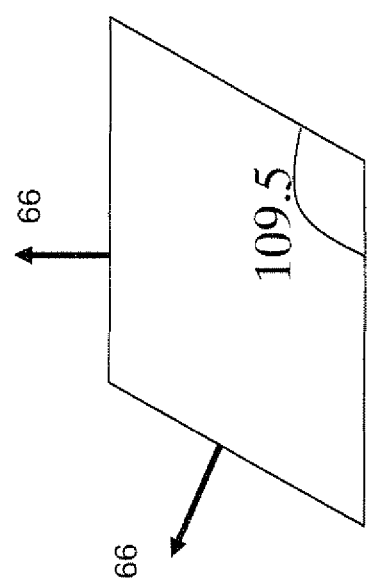
FIG. 12

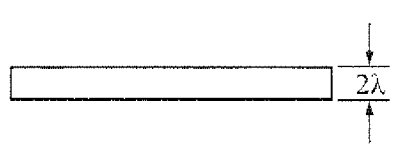
(a) $W_d/\lambda > 2$.
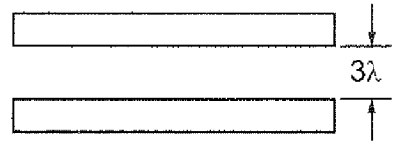
(b) $S_{dd}/\lambda > 3$.
(c) $W_p/\lambda > 2$.
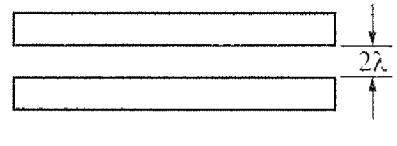
(d) $S_{pp}/\lambda > 2$.
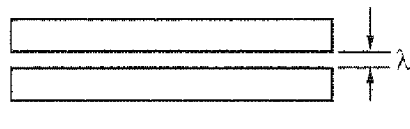
(e) $S_{pd}/\lambda > 1$.
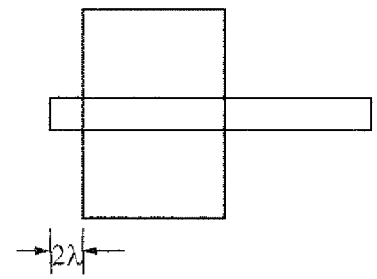
(f) $E_{pd}/\lambda > 2$.
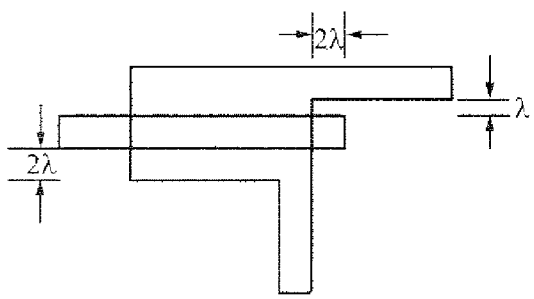
(g) Example of several rules.
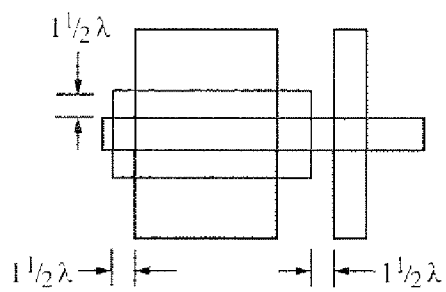
(h) $S_{ig}/\lambda > 1\frac{1}{2}$; $E_{ig}/\lambda > 1\frac{1}{2}$.
PLATE 2   nMOS design rules
FIG. 14

METHOD OF FABRICATING MEMS, NEMS, PHOTONIC, MICRO- AND NANO-FABRICATED DEVICES AND SYSTEMS

CROSS-REFERENCE TO RELATED APPLICATIONS

This application claims the benefit of U.S. Provisional Application No. 61/318,516, filed Mar. 29, 2010, the entire contents of which are incorporated herein by reference.

FIELD OF INVENTION

The present invention is directed to an improved method for the fabrication of Micro-Electro-Mechanical Systems (MEMS), Nano-Electro-Mechanical Systems (NEMS), Photonics, Nanotechnology, 3-Dimensional Integration, and Micro- and Nano-Fabricated Devices and Systems for both rapid prototyping development and manufacturing. In addition, the present invention is applicable to any field of endeavor whereby the fabrication processes use semiconductor or semiconductor-like processing techniques and use-customized process sequences.

BACKGROUND OF THE INVENTION

Advances in Micro-Electro-Mechanical Systems (MEMS), Nano-Electro-Mechanical Systems (NEMS), Photonic, as well as any devices or systems employing Micro- and Nano-Fabricated technology in their implementation promise to revolutionize many products by bringing together the computational capability of microelectronics with the perception and control capabilities of miniaturized sensors, actuators, and other devices, thereby enabling smart systems-on-a-chip to be mass-produced. The use of smart systems that can actively and autonomously sense and control their environments has far reaching implications for a tremendous number of future military and industrial applications, and promises significant benefits for the economy and citizens. Several commercial products using these technologies have reached the marketplace, due in large part to focused and sustained investment. Nevertheless, these products are mostly limited to a few high volume markets in a few selected application domains, due to the enormous cost and time it takes to develop a manufacturing process using these technologies. Consequently, the true potential of these technologies is still unfulfilled for various low volume applications. Additionally, even for high-volume markets, the time and cost it takes to develop and take a device into production, as well as the unpredictability of such time and cost, makes commercialization of technologies that rely on customer micro- and nano-fabrication unattractive and risky.

As a result of the enormous cost (e.g., tens to hundreds of millions of dollars) and time (e.g., 3 years or more) it has traditionally taken for products based on these technologies to be designed, developed and reach the marketplace, even the very large volume markets have shown an unattractive return on investment. This is largely the result of the need to design and implement (from individual process steps) a separate and customized process sequence for each new device and/or system design. For small volume markets, access to these important technologies is thus limited. Therefore, a new approach for implementation is needed (in both development and manufacturing) to allow developers to focus on innovative designs and applications rather than spending time and money developing unique process sequences for every device. This new approach will allow devices and systems to be developed much more quickly, brought to market faster, and at lower cost.

A major obstacle in the implementation of devices and systems employing these technologies is the lack of properly defined and standardized fabrication toolsets for the implementation of development prototypes as well as in production. One consequence of not having these fabrication standards is that the only viable approach available for development is to create a fully customized process sequence for each device. Additionally, it also may be necessary to develop individual processing steps in the process sequence, thereby increasing cost even more. Indeed, the inevitable and undesirable outcome of this approach is that these endeavors are prohibitively costly, time consuming, and much more risky than desirable.

The present invention can be used to radically accelerate the development of devices using these technologies and is scalable with production volume. For manufacturing purposes, fabrication process sequences for devices must be reproducible and repeatable, and simultaneously have sufficient flexibility so that they can be used for many different device types without significantly diminishing resulting device performance. The kernel of the present invention is a comprehensive set of general purpose (and reusable) "process modules" or "process building blocks" that can be used and reused effectively for a broad array of different device types, thus providing elements of a toolset for streamlining the creation of process sequences. By taking advantage of reusable process building blocks, device development can be undertaken in a much shorter period of time, with a considerably higher return on investment, and with lower risk levels. Importantly, this proposed solution is applicable to MEMS, NEMS, photonics, etc., as well as other technology domains that employ a large diversity of materials and processing techniques and which also require customized or semi-customized process sequences, such as microelectronics, nanotechnology and heterogeneous integration, including 3-dimensional integration.

Consequently, it is extremely desirable to have the means to be able to transition these advanced technologies from their present state of an "art form" practiced by a few select experts to a much more desirable state where fabrication for both development and production can be standardized and commoditized. The present invention enables the design for manufacturability for these technologies, whereby design and process rules can be built around these standardized process modules, thereby allowing device design and fabrication to be de-coupled, in a manner similar to what has evolved in Very-Large Scale Integration (VLSI) design of microelectronics. The impact of the present invention is to unleash the enormous potential of these technologies, much as what happened when microelectronics implementation became standardized and commoditized.

SUMMARY OF INVENTION

The present invention relates to an improved method for the fabrication of Micro-Electro-Mechanical Systems (MEMS), Nano-Electro-Mechanical Systems (NEMS), Photonic, Micro- and Nano-Fabricated Devices and Systems for both rapid prototyping development and manufacturing. In addition, the present invention is applicable to any field of endeavor whereby the fabrication processes use semiconductor or semiconductor-like processing techniques and employ customized process sequences for their implementation.

The present invention has utility in device fabrication, systems integration, as well as for packaging of devices, and is very useful for many applications, since it can improve the performance and reliability, as well as reduce the fabrication and packaging complexity and cost for a large number of devices and systems that employ custom process sequences for implementation.

The present invention is applicable to any technology that uses a wide diversity of processing techniques and material types, wherein the devices and systems for specific applications employ customized process sequences.

The present invention involves a method of formulating the fabrication of most any device type using standardized processing modules that are analogous to building blocks.

Through the employment of standardized process modules or building blocks, the implementation of a wide variety of different device types can be performed at lower cost and at a faster rate than is currently possible in the present state of the art.

The present invention allows design and process rules to be created wherein the design of devices can be automated and thereby greatly improving implementation over the current state of the art.

Even in situations wherein the process sequence for a device implementation cannot be completely performed using process modules of the present invention, the present invention allows the process sequence to employ process modules for a portion of the process sequence, thereby greatly improving implementation over the current state of the art.

BRIEF DESCRIPTION OF THE DRAWINGS

FIG. 1 is a table showing examples of time and cost to market of MEMS devices.

FIG. 12 shows the use of oriented wafers to obtain vertical sidewalls in a wet anisotropic etching process module.

FIG. 14 shows design rules from Mead-Conway.

DETAILED DESCRIPTION OF THE INVENTION

The present invention is directed to an improved method for the fabrication of Micro-Electro-Mechanical Systems (MEMS), Nano-Electro-Mechanical Systems (NEMS), Photonic, Micro- and Nano-Fabricated Devices and Systems for both rapid prototyping development and manufacturing. In addition, the present invention is applicable to any field of endeavor in which fabrication processes use semiconductor or semiconductor-like processing techniques and use-customized process sequences.

Despite the enormous economic and strategic merits of technologies that use micro- and nano-fabrication techniques for implementation, the industries based on these technologies have grown at a much slower rate than predicted by experts. This is primarily a result of the cost and time it takes to develop for market, devices and products using these technologies, which is a direct consequence of the lack of well-established, well-defined and standardized process technologies. In current practice, a designer must choose from an enormous range of process options without a priori knowledge of exactly which processing steps will work best for the fabrication of a given device, not to mention how to integrate these processing steps into a viable process sequence. Consequently, there is an enormous amount of customization that routinely takes place in fabrication using these technologies, which results in a tremendous number of variables that must be understood and controlled in order to develop a process sequence that meets the performance requirements, provides an acceptable yield, and meets the product cost goals.

FIG. 1 is a table showing some representative examples of the cost and time to market for various MEMS devices that have transitioned to the commercial market. It is important to note that the development times in this table are conservative estimates, since most do not take into account the time spent by the companies developing these devices in performing preliminary research and development (R&D) before initiating a more focused device development that resulted in a manufacturable device. In both integrated and non-integrated MEMS devices, the average time to market is shown in the table of FIG. 1 to be more than a decade at a cost of many millions of dollars.

Figures 2, 3:
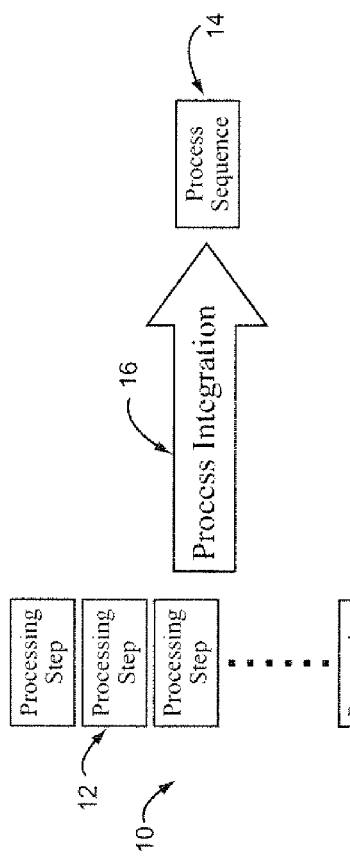
FIG. 2 is a table showing examples of time from discovery to full commercialization for different MEMS device technologies.
FIG. 3 is an illustration to show how a process sequence (on right) is composed of a linear ordering of individual processing steps (on left).

Recently, it was reported that it takes an average length of 25 years from discovery to the full commercialization for MEMS devices. This analysis was not based on a specific product development cycle, but instead was focused on a device technology type. FIG. 2 is a table showing the time from discovery to full commercialization for a variety of different MEMS device technologies.

While this is the current situation for development and production in MEMS technology, the same is also the case for other technologies that use micro- and nano-fabrication techniques combined with customized process sequences for their implementation. These other technologies include NEMS, photonics, Nanotechnology, 3-Dimensional Integration, as well as many Micro- and Nano-Fabricated Devices and Systems.

Importantly, in order for industry to take the risk to make substantial investments in these technologies, there is a requirement to be able to get products based on these technologies to market more quickly and less expensively. A widely accepted upper limit on development time in the commercial sector is about 3 to 4 years, and the anticipated returns on investment needs to be positive and relatively predictable.

While most technologies based on micro- and nano-fabrication have roots and borrow heavily from the same fabrication technologies developed by the Integrated Circuits (IC) microelectronics industry, it is important to note that there are several very substantial differences in these technologies that have enormous implications in their implementation.

Reviewing these differences will help to better understand some of the development and manufacturing challenges of these technologies.

The first major difference between integrated circuits and other technologies based on micro- and nano-fabrication relates to the number and diversity of devices that are fabricated. The vast majority of microelectronics technologies only employ three basic device types, i.e., transistors, resistors and capacitors. In comparison, technologies based on micro- and nano-fabrication technology have a seemingly infinite array of different devices, including pressure sensors, accelerometers, gyroscopes, vibration sensors, magnetic sensors, microvalves, micropumps, optical switches, optical modulators, and chemical sensors, and the list goes on and on.

The second major important difference between microelectronics and other technologies based on micro- and nano-fabrication relates to how the devices are fabricated. The microelectronics domain has converged to a relatively small number of "standardized" or "fixed" process technologies, such as complementary metal oxide semiconductor (CMOS), Bipolar, BiCMOS, etc., for making integrated circuits. As a result, microelectronic process technologies are both well-defined and highly standardized. Furthermore, there are a relatively small number of process technologies that are required to serve all of the microelectronics applications. This has also allowed sophisticated design tools to be made that allow nearly complete separation between design and fabrication. Other technologies based on micro- and nano-fabrication (i.e., non-microelectronics technologies such as MEMS, NEMS and photonics technologies), on the other hand, employ an enormous diversity of device types and each device type typically been implemented using its own unique, i.e., "fully customized" process sequence. Currently, there is no equivalent of a standardized microelectronic process technology, such as CMOS, that will satisfy a majority of these other technologies based on micro- and nano-fabrication device fabrication needs. The current practice of developing a process technology for each device using technologies based on micro- and nano-fabrication is very costly and time-consuming. As clarification, microelectronics, integrated circuits and ICs are all used interchangeably in this description, and essentially refer to the same category of technologies that is a sub-set of technologies that employ micro- and nano-fabrication techniques for implementation.

The third major difference between microelectronics and other technologies based on micro- and nano-fabrication relates to what the devices are fabricated from. That is, these other technologies based on micro- and nano-fabrication employ a more vast array of processing capabilities and diversity of materials than found in IC fabrication. Other technologies based on micro- and nano-fabrication typically use conventional process capabilities borrowed from the IC world, such as oxidation, low pressure chemical vapor deposition (LPCVD), and photolithography, and combines these traditional IC processes with highly-specialized techniques, such as "micromachining," "nanomachining," "through-wafer vias," "wafer bonding," etc. Consequently, developers working in these other technologies based on micro- and nano-fabrication have a much richer range of choices regarding materials and fabrication techniques than is commonly available in the IC domain. However, one byproduct of this process freedom is that these developers have comparatively little in the way of standard process technologies to leverage for implementation of their devices.

Another significant difference between IC fabrication and other technologies based on micro- and nano-fabrication concerns the production volumes of devices that are fabricated. Specifically, the production volumes in microelectronics are often very larger than the production volumes in other non-IC technologies that employ micro- and nano-fabrication. ICs are produced using batch-fabrication and continuous flow manufacturing techniques, in which large numbers of wafers are processed in batches and in an identical fashion (i.e., using a standardized process sequence or technology, such as CMOS) with either identical device designs (e.g., the Intel production model) or with different designs (e.g., the Taiwan Semiconductor Manufacturing Company (TSMC) model). The advantage of batch-fabrication is that the development and production costs are spread over many devices, and therefore large economies of scale can be obtained. For other technologies based on micro- and nano-fabrication, the situation is quite different. Typically, the volumes in other technologies based on micro- and nano-fabrication are inherently lower due to the specialized nature of the specific devices. For example, a MEMS inertial sensor designed for automobiles as a crash air bag deployment sensor may be very useful for that specific application, but the process technology used to make this device may not be suitable for any other applications. As a consequence of the specialization of devices made using these other non-IC technologies based on micro- and nano-fabrication, the overall market size for a given device type, as measured by the number of devices manufactured annually to satisfy the market need, is frequently quite small in comparison to microelectronic production volumes. Indeed, many devices made using other technologies based on micro- and nano-fabrication, particularly for Department of Defense (DoD) applications, are expected to have market sizes that are very small (e.g., hundreds or thousands of devices per year).

Before reviewing the current approach taken to develop process sequences for other technologies based on micro- and nano-fabrication, a few definitions are provided. A "processing step" is defined as a single procedure that is performed on a substrate or a set of substrates in order to progress the fabrication of a device, and represents essentially the smallest granularity of fabrication. At the other extreme is a "process sequence", which is defined as a grouping of processing steps that have been characterized, standardized, and assembled into an ordered sequence that is sufficient to result in functional devices. A process sequence will typically be re-used on a periodic basis for the production of devices. Process sequences that have become standardized and transitioned into production are often referred to as "process technologies". Lastly, "process integration" is the technique by which processing steps are combined into an ordered sequence with the goal of creating a methodology that allows the production of functional MEMS devices. More specifically, process integration involves the selection, understanding, characterizing, and optimizing the individual processing steps and their inter-relationships with the goal of having them effectively work together as a standardized production method to meet a specific acceptable performance, yield, and cost level. Process integration is often the most cost and time-consuming part of process sequence development. Consequently, if the effort spent on process integration can be reduced, then development will be accelerated and made less expensive. This is the focus of the present invention.

As illustrated in FIG. 3, the current approach to MEMS implementation 10 takes a multiplicity of selected individual processing steps (12) and combines them into a process sequence (14) using the methods of processing integration 16. The type of each processing step 12, as well as the number and ordering of the processing steps 12 used in any process sequence 14 can vary over a very large range, depending on the exact nature of the device to be implemented. Larger process sequences may be composed of hundreds of individual processing steps with a dozen or more of lithography steps and a dozen or more different material depositions and etches. In many process sequences, certain types of processing steps, such as photolithography and photoresist strips, may be repeated several times throughout the sequence.

A fully customized process sequence 14 composed of individually selected processing steps 12 shown in FIG. 3 would initially have the attributes of a maximum amount of design and process freedom, the highest level of flexibility, no standardization of the sequence, and no available design rules. This would represent the current state of affairs of most technologies based on micro- and nano-fabrication. In comparison, once the effort to develop a process sequence was complete and the technology had transitioned into production, the attributes of this process sequence would include: the least amount of design and process freedom for other device implementations, least flexibility; full standardization; and the availability of design rules. Importantly, while this sequence may be useful for a specific device for which it was developed, it probably could not be used to implement any other devices. This explains why process sequences are not reused for implementation of other device types that employ micro- and nano-fabrication technologies.

Figure 4:
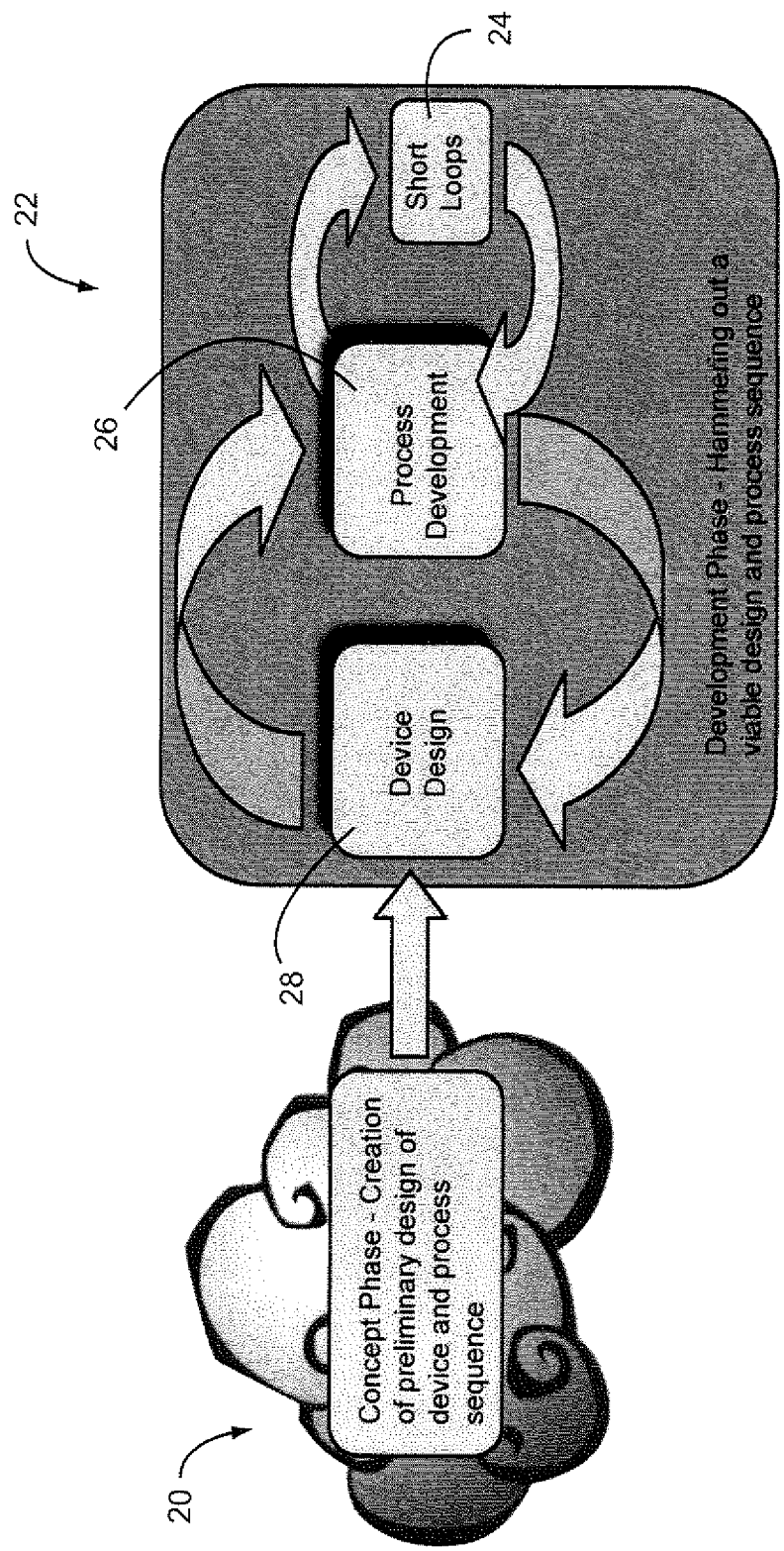
FIG. 4 depicts a strategy for process development showing a large amount of iteration to develop a viable process sequence for the implementation of MEMS, NEMS, Nanotechnology, photonic, etc. devices.

FIG. 4 is a high-level illustration of the current approach undertaken for development of a process sequence for a specific MEMS device. In the first phase, 20 i.e., the Conceptual Phase, the preliminary device design and outline of the process sequence for implementing the design is drafted. At this stage, there are many unknowns and uncertainties, including a lack of material property data and process compatibility issues that the developers will attempt to manage by making reasonable estimates with the goal of "bounding the problem." The output of these efforts will be a set of models, a preliminary process sequence design(s), and a prototype mask layout set. The developers use their experience and judgment to point out the individual processing steps and portions of the processing sequence(s) that will need the most development work and that have the highest risk. A strategy, based on the principles of design of experiments (DOE) will be formulated to develop the individual processing steps that will be needed in the sequence. The fabrication experts design short-loop runs (i.e., sub-sets of sequences) also based on statistical methods such as DOE to develop portions of the process, as well as the entire sequence. Additionally, they will work with the designers to create the designs for a set of test structures that will be useful for measuring the properties of the materials used in the process sequence, as well diagnostic structures and devices to help with the process development 26. The output from the fabrication experts at this stage will be a set of DOEs for all process steps and short loop process runs for the sequences.

With the designs in hand, along with a set of planned process experiments, the fabrication laboratory begins to develop the process sequence in the next phase, i.e., the Development Phase 22. Much of this work is very iterative at many levels. The development of process steps varies the processing parameters over a set of reasonable values, followed by the measurement of the outcomes, which are then documented and statistically analyzed. Similarly, the efforts to develop sequences will rely on the outcome of a number of short loop experiments 24, which will also be documented and statistically analyzed. Once parts of the process sequence are beginning to mature, test structures will be fabricated and measurements taken to determine accurate dimensions and the material property values. These values will be fed back into the device design models 28 and new models will be created. Once the process sequence starts to come together and working devices are beginning to be yielded from the runs, the design and models are further refined, new mask sets are created and the iterations continue. It is reasonable to expect that the first two or more cycles of a new and customized process sequence will not initially yield any working devices. It is also reasonable to expect that once working devices are beginning to be yielded on the runs, that the yields will be low, although higher yields are possible. During subsequent process runs, various process improvements can be employed to increase the yield. At some point, the process of volume learning begins, in which a large enough volume of wafers has been run that the small yield-killers can be reduced or eliminated. At that point, various quality improvement methods (e.g., Taguchi, 6-sigma, pareto, histograms, etc.) can be employed to increase the yield to higher levels (e.g., above 90%). Obviously, the cost and development times are heavily influenced by the complexity of the process sequence for any device type. It is not uncommon to see very large development costs (e.g., in excess of $100M) for the development of many process sequence technologies (see FIG. 1).

Better methods for process sequence development and manufacturing for non-integrated circuit technologies are clearly needed. The present invention is directed toward a method for the development of process sequences and is based on a model of modularized manufacturing, whereby standardized and reproducible collections of processing steps (i.e., process modules) can act as building blocks for process sequences and can be used for the implementation of a multiplicity of different device types. The present invention provides the needed flexibility for fabrication, while simultaneously affording predictability and reproducibility, thereby enabling affordable high-quality manufacturing of micro- and nano-fabricated devices, even for low-volume production.

The present invention relates to an improved method for the fabrication of Micro-Electro-Mechanical Systems (MEMS), Nano-Electro-Mechanical Systems (NEMS), Photonic, Micro- and Nano-Fabricated Devices and Systems for both rapid prototyping development and manufacturing. In addition, the present invention is applicable to any field of endeavor, in which the fabrication processes use semiconductor or semiconductor-like processing techniques and use-customized process sequences. In essence, the present invention is applicable to any technologies that use micro- and nano-fabrication techniques for implementation.

A "process module" is defined as a grouping of processing steps that have been assembled into an ordered sequence, and which have been characterized and standardized, and are re-used on a periodic basis in the production of devices, but which is not sufficient in and of itself to result in functional devices. Therefore, under this definition, a process module could be applied to anything ranging from two or more process steps, up to any number of processing steps just shy of the complete fabrication of a device.

Figure 5:
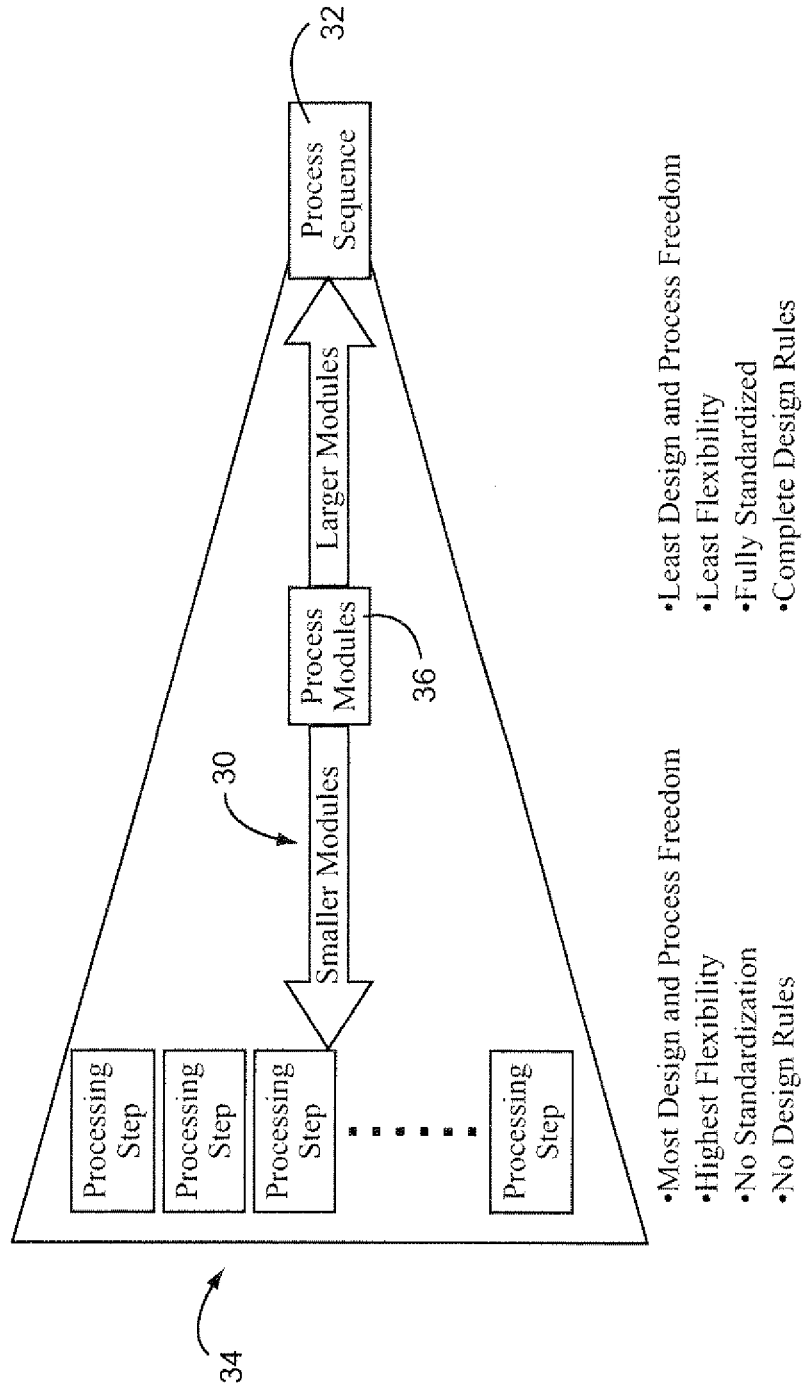
FIG. 5 is an illustration of how process modules fit within the spectrum from processing steps on the left to a complete process sequence on the right.

The number of processing steps contained within a process module can vary over a large range. FIG. 5 is an illustration showing the spectrum 30 of processing granularity that can be used in the construction of process sequences 32. Shown at the left are detailed customized process steps 34 and in the middle of the spectrum are process modules 36 with the size and extent of a process module increasing from left to right. Process modules that are only composed of a few processing steps would be toward the left side of this spectrum and would be small and therefore a complex process sequence made of them may require a relatively large number of process modules. A developer using modules of this size would have to deal with the process integration of a large number of modules (although not nearly as many as if the sequence was composed of individual processing steps). Nevertheless, smaller process modules would provide the device developer with a large amount of design and process freedom. On the other hand, process modules that are composed of a large number of processing steps (i.e., larger process modules more to the right on the spectrum) would reduce the process integration required, but would also provide the designer with less design and process freedom. Therefore, larger modules may have less applicability to the implementation of a large number of different device types.

A standardized process module has an accepted and agreed level of quality and performance, as well as an accepted methodology to measure the module's quality and performance, much as process sequences are standardized. A well-defined process module has the parameters and specifications that are well documented, such that a device developer can design and predict device behavior made with this module with a high degree of certainty. It is important to note that each process module is highly repeatable and reproducible, meaning that if a developer uses a module from a foundry now and then uses the same process module at some time in the future (e.g., a few days, weeks, or even years later), the module can be assumed to be identical. Ideally, a process module available from one foundry can be considered as "identical" to that same process module from any other foundry offering this particular process module.

Figure 6:
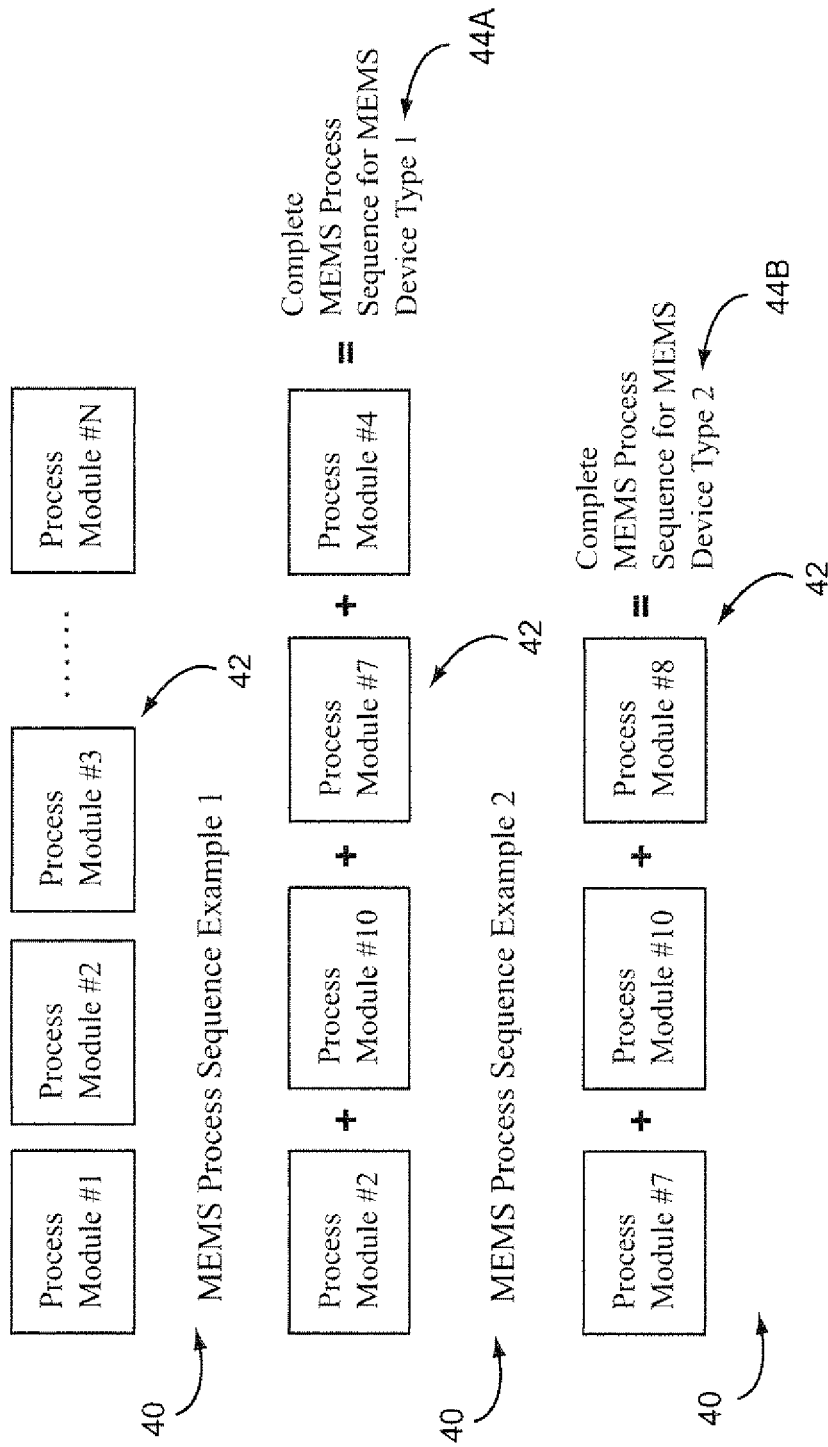
FIG. 6 depicts process sequences based on process modules.

The method of the present invention is based on the use of a variety of different process modules 40 also known as "process building blocks," whereby each of these process modules 40 is a standardized, well-defined, repeatable, and reproducible building block (FIG. 6). For maximum utility, there are a number of different process modules. For example, there are two, three, or more process modules for different types of polysilicon surface micromachining; two, three, or more process modules for different types of metal surface micromachining; several process modules for bulk silicon micromachining; one or more through silicon via modules; and so on. The key concept is that more complicated process sequences 42 can be built from these building blocks 40 by assembling a series of these "building blocks" into an ordered linear array of selected process modules, as shown in FIG. 6.

As noted above, custom micro- and nano-fabrication requires considerable flexibility in the process sequences 42 for different device types 44A and 44B. This model of process modules allows a high level of flexibility since the ordering of the process modules 40 combined with a sufficient number of modules enables many different types of devices 44 to be implemented, depending on how the linear array of process modules 40 is assembled and the types of individual process modules 40 employed in the liner array of process modules to for the process sequence 42. Further, since the modules will be in existence and useful for different device types, there is no need to redevelop them for each new device type once they have been created. That is, the process modules would be reused for many different device types. This will have the effect of dramatically lowering the cost and time for development and getting devices employing custom process sequences for implementation of micro- and nano-fabrication devices into production.

Within this framework, the fabrication for custom process sequences for implementation of micro- and nano-fabrication devices will transition from an art form to a commoditized method of manufacturing. Consequently, this model of modularization for development and manufacturing using process modules provides four very critical benefits to the manufacturing of micro- and nano-fabrication devices employing custom process sequences, i.e., flexibility, reproducibility, speed, and low cost. And these benefits directly translate into enormous time and cost savings for getting devices and products to market.

In general, there are some criteria that these process modules should satisfy. First, each process module should be applicable to multiple device types, and preferably as many different device types as possible. This would imply smaller modules rather than larger ones, since the specificity of the modules to any device type will increase as the module size and complexity increases. However, it is also desired that the modules be as large as possible since this reduces the number of modules that will needed for any device type and more importantly, a fewer number of modules in a process sequence means that there will be fewer interfaces between the modules (i.e., less process integration will be required). Therefore, a balance must be drawn between the size and complexity of the process modules and their applicability to different device types.

Importantly, the present invention of process modularization allows the capability for distributed fabrication to be performed. Distributed fabrication is when portions of the process sequence, that is process modules, are performed at different foundries. This is quite different from the now commonly used technique of single-site foundry production. Distributed micro- and nano-fabrication for both development and manufacturing allows the process sequence to use the best available foundry for each portion of the process sequence. This new approach to fabrication affords better efficiencies, lower costs, higher productivity, higher capacity utilization, higher quality and higher performance compared to the current methods of fabrication.

It can be difficult to compose the content of process modules. The preferred technique is to examine a very large array of device implementation approaches for a very large array of different devices for many different applications. For example, this might entail the development of hundreds or thousands of custom process sequences. Importantly, to understand the similarities of these custom process sequences, it is preferable to use a sophisticated software system that captures every important process and design detail about each and every process sequence run developed, including: materials used; thicknesses of individual deposited layers; depths of etches; temperatures and chemistries of processing steps; types of processing steps; and the ordering of processing steps in each sequence; and this information has been stored in a database. Additionally the mask artwork, as well as the processing metrology data collected during processing each run, is also available. Consequently, an extensive database of these real-life process sequences for many application domains is in existence at the MEMS and Nanotechnology Exchange (MNX) and provides extremely useful guidance. On examination of a large number of process sequences which have been performed, representing over 2,300 individual and custom process sequences, clear patterns are able to be identified in the structure of these process sequences. For example, about 50% of the process sequences completed would be classified as using a surface micromachining technology, with most of them either using polysilicon or single-crystal silicon as the structural layer(s). About 30% of the process sequences have used bulk micromachining, with the majority using bulk micromachining of single-crystal silicon. About 15% of the process sequence use both surface and bulk micromachining technologies. Much smaller numbers have used LIGA and plastic replication process. "LIGA" is a German acronym for Lithographic, Galvanoformung, Abformung (Lithography, Electroplating, and Molding) that describes a fabrication technology used to create high-aspect-ratio microstructures.

This real-life data and information encompassing a diverse and extensive run-history database is an excellent real-world source of data that can be used to design the type and content of modules necessary to cover a wide range of device types while minimizing process integration issues.

Examination of the data discussed above indicates that approximately half of the process sequences used in device implementation in MEMS and NEMS technologies employ a method of surface micromachining, with most using polysilicon or single-crystal silicon as the structural layer(s). Consequently, a preferred embodiment of the present invention will employ one or more surface micromachining process modules, wherein one or more of these surface micromachining process modules will have polysilicon or single-crystal silicon as the structural layer(s).

Figure 7:
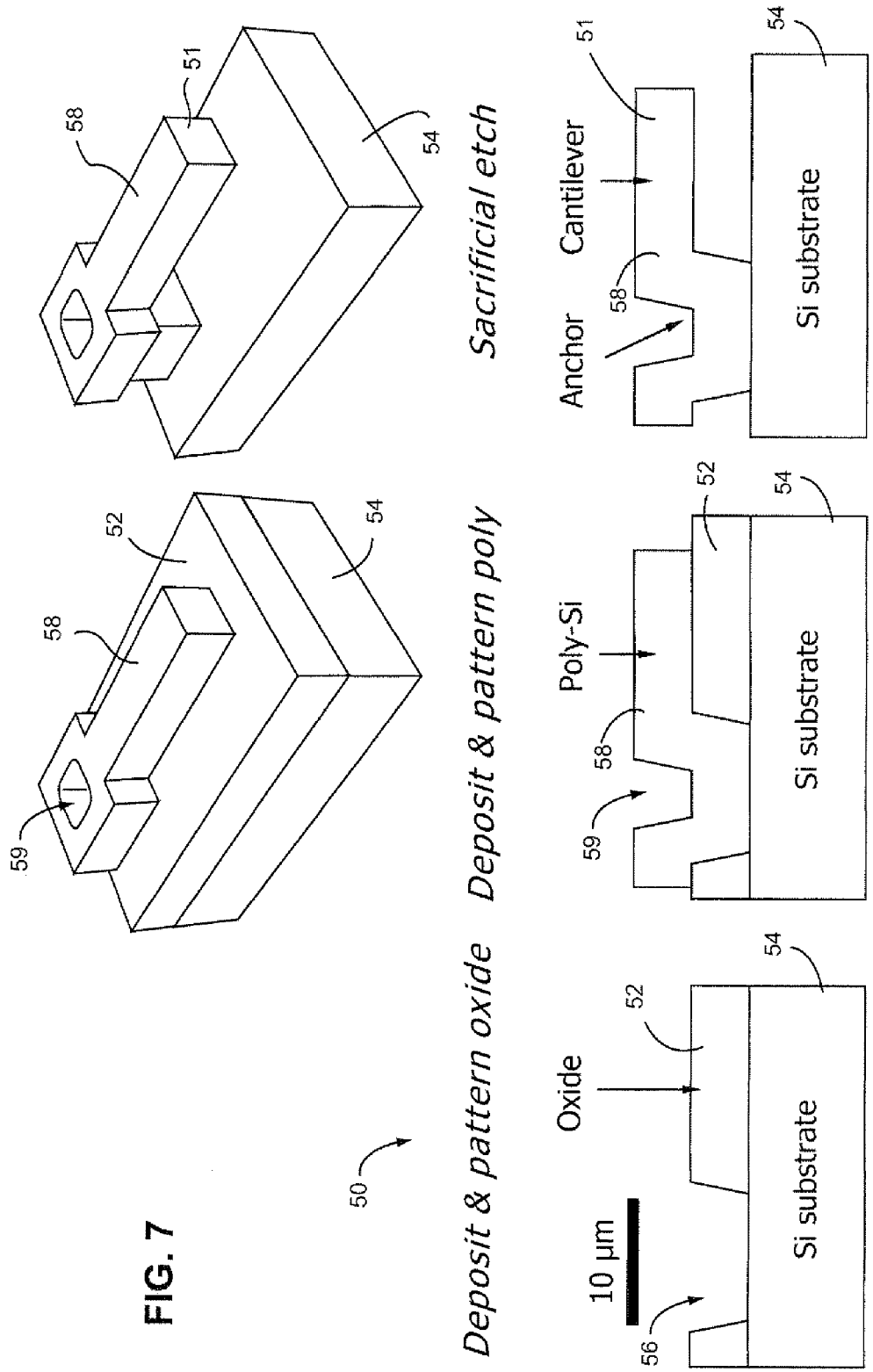
FIG. 7 depicts a surface micromachining process module.

As shown in FIG. 7, a process module 50 for surface micromachining using a structural layer of polycrystalline silicon (polysilicon) is described and would constitute a process module of the present invention. First, a layer of material 52 is deposited on a silicon substrate 54. The layer of material 52 acts as a sacrificial layer in the fabrication. This layer 52 can be deposited using methods of Chemical-Vapor Deposition (CVD), Plasma-Enhanced Chemical-Vapor Deposition (PECVD), Low-Pressure Chemical-Vapor Deposition (LPCVD), Physical-Vapor Deposition (PVD), Atomic Layer Deposition (ALD), Sol-Gel deposition, wafer bonding, etc. The thickness of this layer 52 will be different for different process modules, and a preferred thickness for one module would be less than 0.25 microns, another would be between 0.25 and 0.5 microns, another would be between 0.5 and 0.75 microns, another would be between 0.75 and 1.0 microns, another would be between 1 and 2 microns, another would be between 2 and 5 microns, another would be between 5 and 10 microns, and another would be more than 10 microns. In FIG. 7, this layer 52 is shown as silicon dioxide, but any material layer can be used, including, but not limited to single-crystal silicon, ceramic materials, metals, dielectrics, and polymers, depending on the material compatibility requirements between the substrate, sacrificial layer and structural layer. After deposition, the sacrificial layer may be subsequently patterned and etched 56 to expose areas in the layer 52 to the underlying substrate 54. Subsequently, a layer of structural material 58 is deposited. This layer 58 can be deposited using methods of Chemical-Vapor Deposition (CVD), Plasma-Enhanced Chemical-Vapor Deposition (PECVD), Low-Pressure Chemical-Vapor Deposition (LPCVD), Physical-Vapor Deposition (PVD), Atomic Layer Deposition (ALD), Sol-Gel deposition, wafer bonding, etc. The thickness of this layer 58 will be different for different process modules, and a preferred thickness for one module would be less than 0.25 microns, another would be between 0.25 and 0.5 microns, another would be between 0.5 and 0.75 microns, another would be between 0.75 and 1.0 microns, another would be between 1 and 2 microns, another would be between 2 and 5 microns, another would be between 5 and 10 microns, and another would be more than 10 microns. In FIG. 7, this layer 58 is shown as polysilicon, but any material layer, including, but not limited to single-crystal silicon, ceramic materials, metals, dielectrics, and polymers, can be used, depending on the material compatibility requirements between the substrate 54, sacrificial layer 52 and structural layer 58. After deposition, the structural layer 58 may be subsequently patterned and etched 59 to form the desired shape of the structural layer. Subsequently, the sacrificial layer 52 is removed, thereby making possible the implementation of free-standing structures, such as the cantilever 51, as shown in FIG. 7.

Although we have shown only one form of surface micromachining using only one structural layer and one sacrificial layer, it is understood that the present invention encompasses process modules having a multiplicity of structural and sacrificial layers, including process modules where there are more or less structural layers than there are sacrificial layers. Moreover, the present invention also encompasses process modules whereby the structural and sacrificial layers are any form of thin films or material layers that are commonly used in micro- and nano-fabrication. Additionally, even though the process module illustrated in FIG. 7 uses a silicon wafer for the base substrate 54, it is understood that the present invention also encompasses any substrate type, shape, thickness or material type that are commonly used in micro- and nano-fabrication.

As described above, after deposition, the structural layer 58 may be subsequently patterned and etched 59 to form the desired shape of the structural layer. Alternatively, additional layers of sacrificial and structural layers may be deposited and these may be individually or collectively patterned and etched depending on the exact device design. The essential elements of the surface micromachining process module are thus described and one or more of these surface micromachining process modules may be employed in device's implementation to form a process sequence for a device depending on the exact device design. Additionally, one or more surface micromachining process modules may be combined with any other process modules of any type and number, or any other combination of individual process steps of any type or number, to form a complete process sequence for device implementation.

Figure 8:
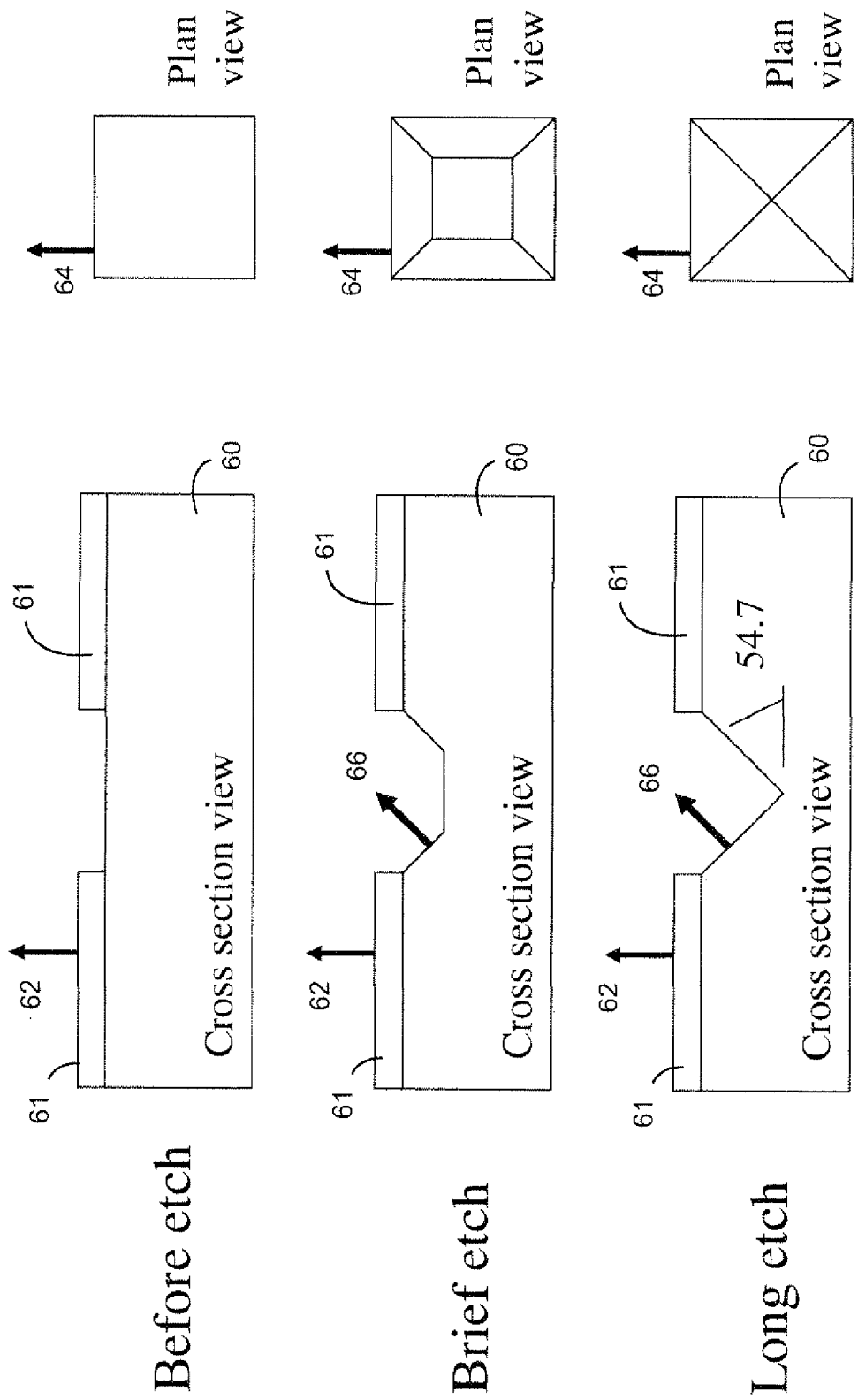
FIG. 8 depicts bulk micromachining using anisotropic wet chemical etching.

The present invention also includes process modules based on bulk micromachining methods of fabrication, as detailed in FIG. 8. Bulk micromachining in the present invention includes wet and dry etching methods that can be either anisotropic or isotropic.

Wet anisotropic etching employs a chemical solution that etches the substrate material 60, wherein the etch rate is dependent upon crystallographic orientation of the substrate. The mechanism by which the etching varies according to silicon crystal planes is attributed to the different bond configurations and atomic density that the different planes expose to the etchant solution. Silicon crystal lattice is of the Diamond type and is two interpenetrating face-centered cubic unit cells. Wet anisotropic chemical etching described in terms of etch rates according to the different normal crystallographic planes usually 62, 64, and 66.

The ability to delineate the different crystal planes of the silicon lattice in anisotropic wet chemical etching provides a high-resolution etch capability with reasonably tight dimensional control. It also provides the ability for two-sided processing to embody self-isolated structures, wherein only one side is exposed to the environment. This assists in packaging of the device and is very useful for devices, such as MEMS devices, exposed to harsh environments. In general, silicon anisotropic etching etches more slowly along the planes 66 than all the other planes in the lattice, the difference in etch rate can be as high as 1000 to 1. The planes 66 have the highest density of exposed silicon atoms in the etchant solution, with 3 silicon (Si) bonds below the plane, chemical shielding of the surface may be occurring. Although FIG. 8 illustrates bulk wet anisotropic etching on a 62 crystallographic orientation silicon wafer substrate 60, it is understood that the bulk micromachining process modules of the present invention is applicable to silicon wafer substrates 60 having different crystallographic orientations, such as 64 and 66, as well as to other substrate material types.

FIG. 8 illustrates some of the features possible with wet chemical isotropic etching. Shown are cross sections and plan views of a substrate 60, such as silicon, with a masking layer 61 on the top surface. When exposed to the etchant solution, it etches preferentially along certain crystallographic planes and slow along other planes, thereby resulting in anisotropic etch profile.

Figure 9:
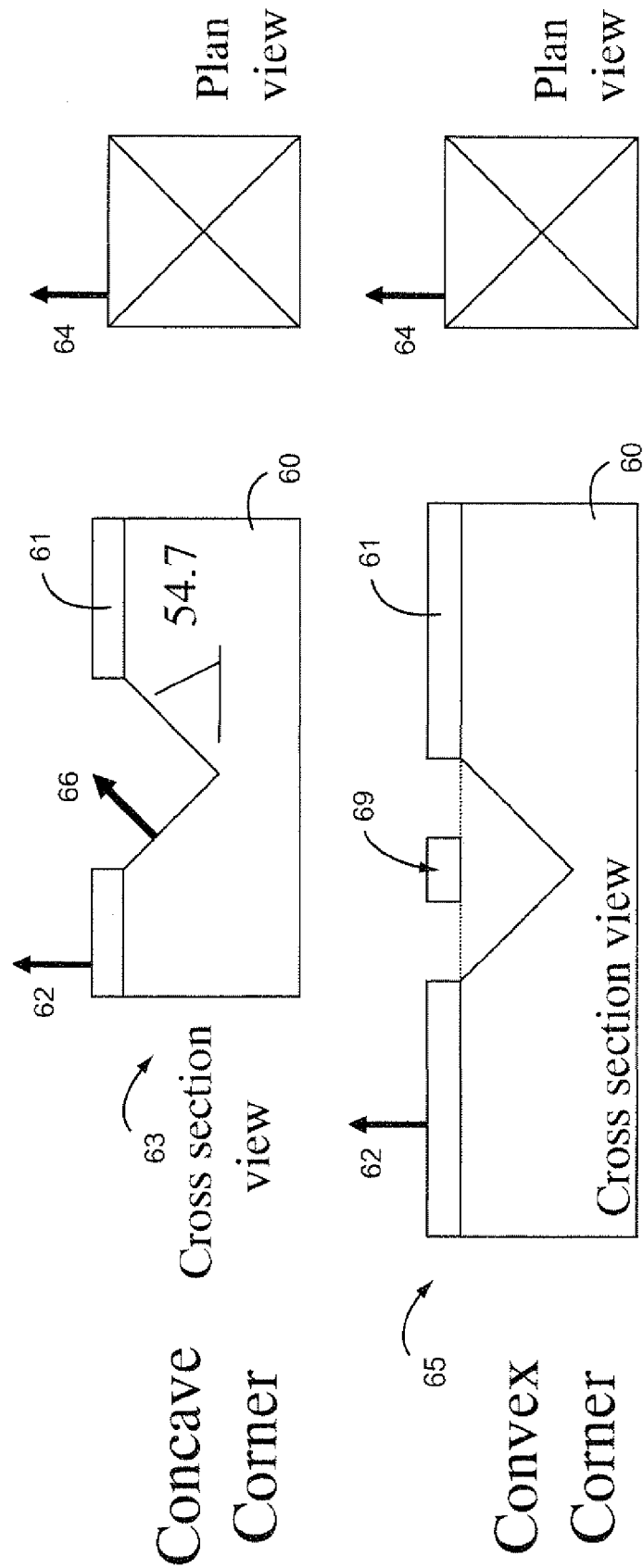
FIG. 9 shows the formation of different shapes using wet chemical anisotropic etching for a bulk micromachining process module of silicon.

FIG. 9 illustrates how using this method of bulk micromachining can be used to implement different structures, including concave and convex corner structures 63 and 65, as shown in FIG. 9 a well as free-standing structures 69.

Figure 10:
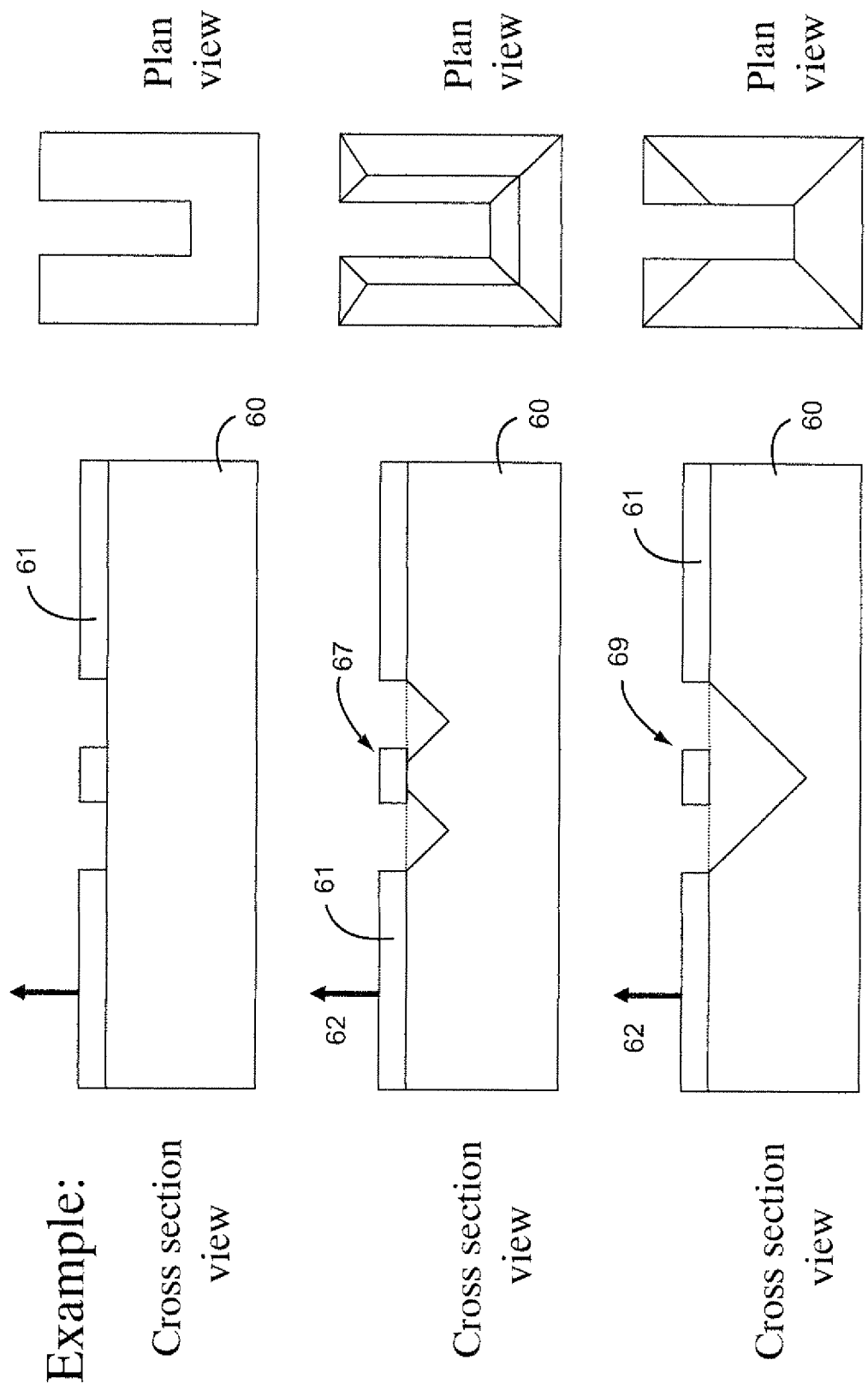
FIG. 10 depicts the making of a cantilever structure using a bulk micromachining process module.

This is shown in more detail in FIG. 10, wherein a specific mask design combined with this method of fabrication of this process module can be used to create undercut bridges and cantilevers 69 out of a substrate 60, such as single-crystal silicon.

Figure 11:
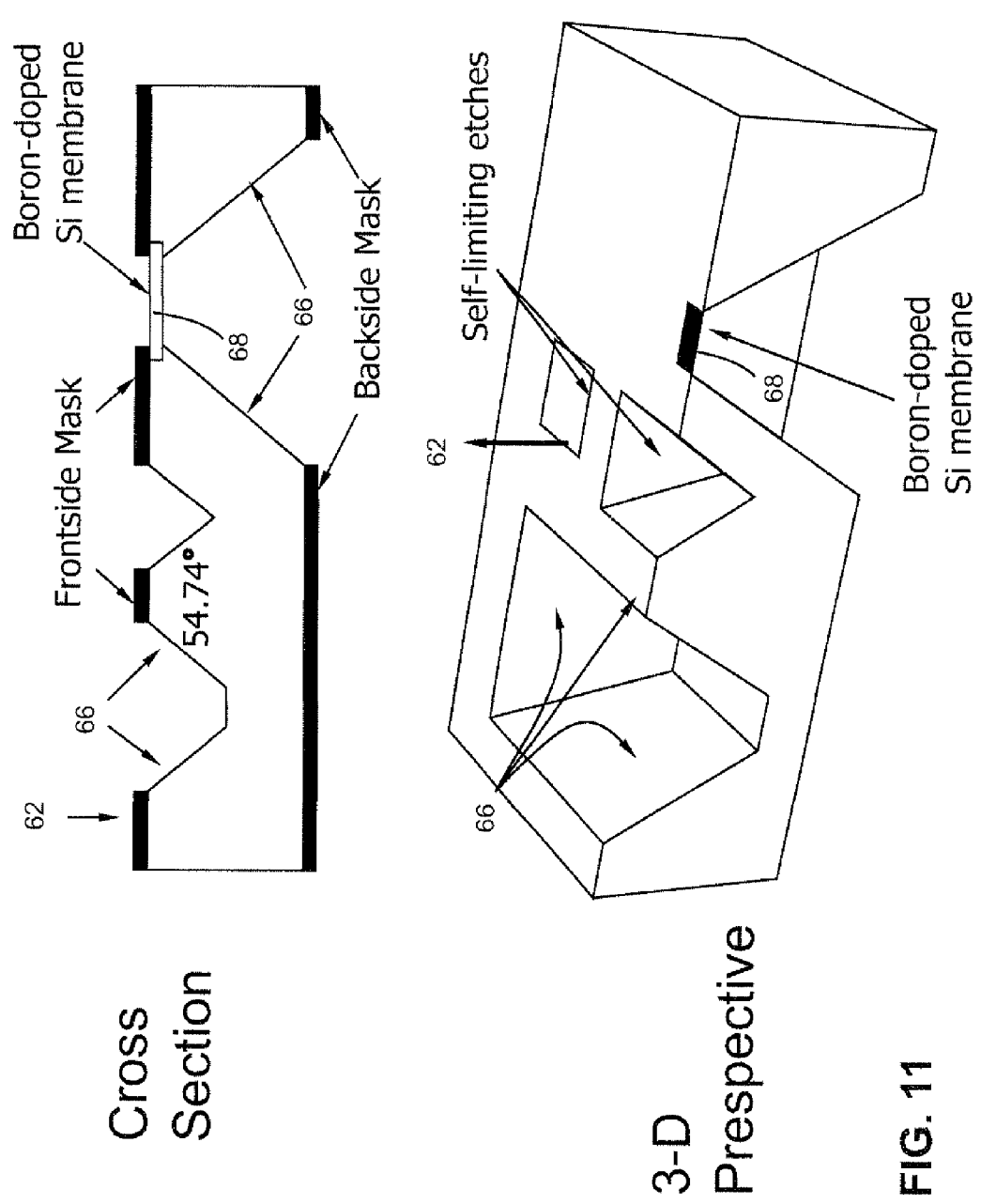
FIG. 11 shows shapes made using a bulk micromachining process module.

FIG. 11 shows a multiplicity of different shapes that can be implemented in substrates using a bulk micromachining process module based on wet chemical anisotropic etching. FIG. 11 shows the use of Etch stop composed of a Boron-doped Si(licon) membrane 68, which is a very useful technique to control etching process and provide uniform etch depths across wafer and from wafer lot to wafer lot. Three types of etch stop methods are generally used in bulk micromachining process modules including: timed etch; dopant etch stop; and electrochemical etch stops. Timed etches are difficult to control and etch rate is very dependent upon sample thickness uniformity, etchant species diffusion effects, loading effects, etchant aging, surface preparation, etc. Both dopant etch stops and electrochemical etch stops use selective doping of the substrates to prevent to allow the substrate material to be preferentially etched. The dopant etch stops do not require anything but regions with different doping types and concentrations, whereas in electrochemical etching, an electric field is applied during etching to modify the etch characteristics of the substrate.

By employing substrates with different crystallography orientations, specifically, the use of substrate with specific crystallographic plane orientations, such as the 64 silicon planes 64 shown in FIG. 12, structures 70 with vertical sidewalls 72 during etching with very little undercutting, if the mask is aligned properly to crystal planes, can be made as shown in FIG. 12.

Additionally, even though the process modules illustrated in FIGS. 8 through 12 use a silicon wafer for the base substrate, it is understood that the present invention also encompasses any substrate type, shape, thickness or material type that are commonly used in micro- and nano-fabrication. This includes Silicon-On-Insulator (SOI) substrates, as well as substrates made of glasses, ceramics, and metals. Also, it is understood that the dimensions of the etched features encompass any depth from the entire wafer to less than one micron and lateral dimension ranging from less than one micron to over one millimeter.

Additionally, it is understood that these process modules within the category of bulk micromachining encompass any material as a masking layer material and any method of patterning and etching to expose the substrate to the etching solution. Commonly used masking materials include: Thermally Grown $SiO_2$, wherein the etch rate in Potassium hydroxide (KOH) is relatively high, but has a low etch rate in Hydrazine and EDP and most other hydroxide solutions; Silicon Nitride, wherein the etch rate is very low in most anisotropic etchant solutions; Some types of polymers; and many types of metals including Ta, Au, Cr, Ag, and Cu hold up well in EDP, Al holds up in Tetramethylammonium hydroxide (TMAH or TMAOH), an anisotropic etchant of silicon.

Bulk micromachining process modules of the present invention also include wet isotropic etching, gas isotropic etching, and reactive ion etching, including Deep Reactive Ion Etching (DRIE). In isotropic wet etching, the chemical etchant has no preferential etch planes in the substrate crystal, and thereby etching the material equally or nearly equally in all directions. Gas isotropic etching includes the use of Xenon Difluoride (XeF2) which is not wet, but etches silicon isotropically. DRIE technology process modules allow high aspect ratio structures to be etched into silicon and use a high density plasma to alternatively etch (with SF6 chemistry) and deposit an etch resistant polymer (C4F8 chemistry) layer on sidewalls to implement etched features that are deep and have a high aspect ratio, as high as 10 to 1 or more. This etch technology provides one of the most anisotropic etch profiles available in micromachining and with regard to the substrate crystallographic orientation.

Figure 13:
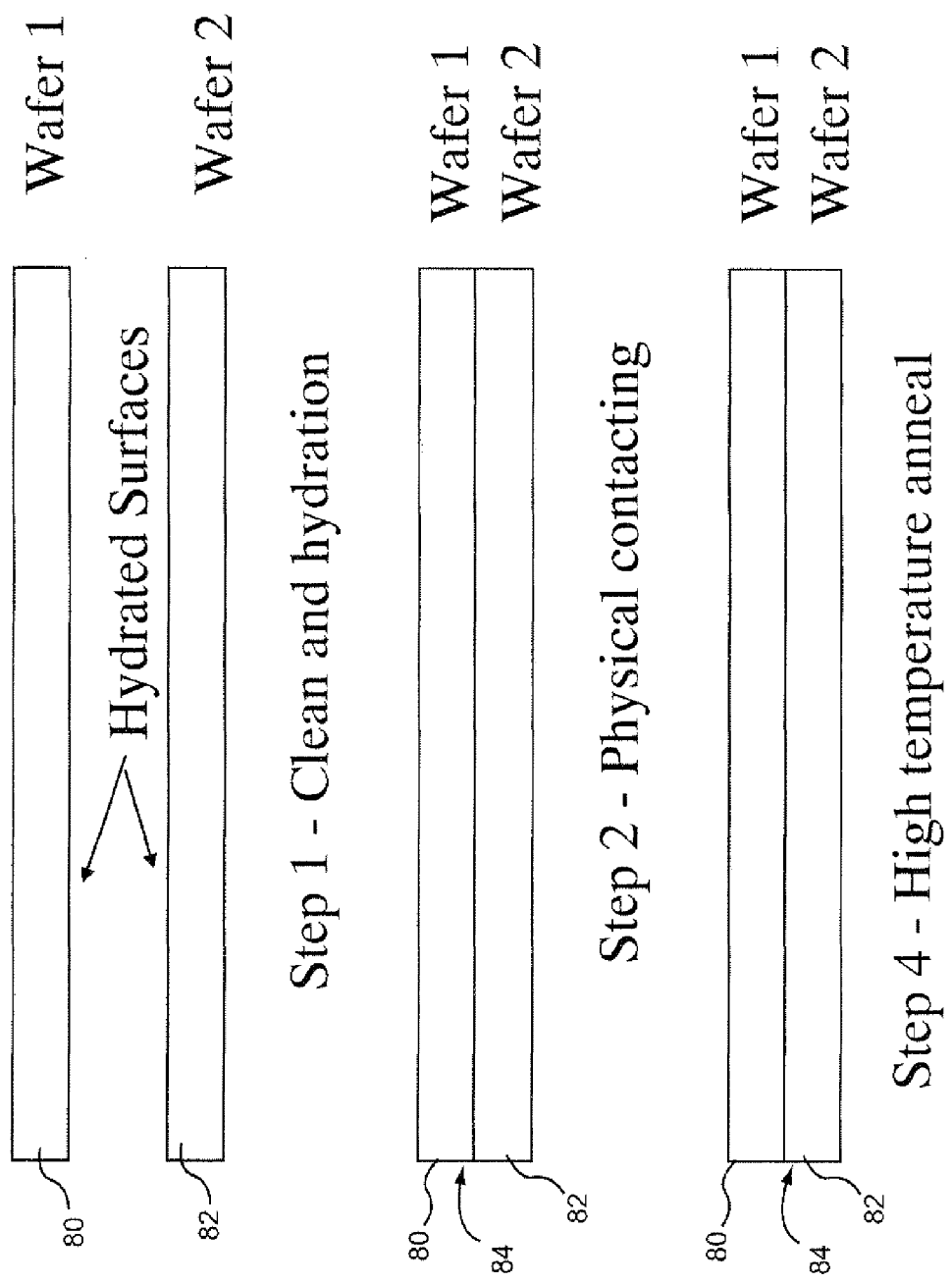
FIG. 13 illustrates a direct fusion wafer bonding process module.

The present invention also includes process modules for wafer bonding, which is a method for joining two (or more) wafers 80 and 82 together to create a multi-wafer stack 84 (FIG. 13). Similar to welding in the macroscale world. There are generally three types of wafer bonding that can be employed as process modules. These include: direct (fusion) bonding; field-assisted (anodic) bonding; and bonding using an intermediate layer, which all would be encompassed as process modules of different types within the present invention.

The present invention also includes process modules using laser micromachining, that is, lasers that can generate an intense amount of the energy in very short pulse of light and direct that energy onto a selected region of material. Among the many types of lasers that can possibly be used for micromachining process modules include: CO2, YAG, excimer, etc., each has its own unique properties and capabilities suited to particular applications. Factors that determine the type of laser to use for a particular application include laser wavelength, energy, power, and temporal and spatial modes; material type; feature sizes and tolerances; processing speed; and cost. The action of CO2 and Nd:YAG lasers is essentially a thermal process, whereby focusing optics are used to direct a predetermined energy/power density to a well-defined location on the work piece to melt or vaporize the material. Another mechanism, which is nonthermal and referred to as photoablation, occurs when organic materials are exposed to ultraviolet radiation generated from excimer, harmonic YAG, or other UV sources. Factors that determine the type of laser to use for a particular application include laser wavelength. Femtosecond lasers, that is, based on extremely short pulses of light are also employable in process modules.

The present invention also includes process modules using through-wafer or through-substrate vias (TWV and TSV). These involve the formation of areas through a substrate, which then have a conductive material deposited, so as to enable electrical conductivity from one side of the wafer or substrate to the other side. These process modules are useful for packaging and 3-D integration as well as many other device implementations.

The present invention also includes process modules using Lithographic Galvanoformung Adformung (LIGA), high-aspect ratio polymer and plating processes, as well as plastic replication processes, including molding and embossing.

It is understand that the present invention is encompasses many more process modules than described herein and is applicable to any series of processing steps that can be combined in a process module for use in device implementation.

The present invention of fabrication based on modular-based fabrication allows foundries to increase capacity utilization by increasing dramatically the number of device types that the foundries can produce, which could lead to lower costs. Furthermore, since the foundries can get out from their current and unprofitable business of endless process development that consumes an inordinate amount of resources, and instead focus on production, their revenue and income will improve and thus increase the vitality of several important high-technology industries. Businesses interested in developing products using these technologies would be able to predict the cost and time-to-market with a high level of certainty, and this would spur significantly more investment in device and product development.

It is envisioned that there would be many process modules, but each of the process modules would ideally be available from a number of different foundries. Since these modules would be virtually self-contained and their designs independent of the foundries offering them, a market for distributed development and manufacturing industry is expected to evolve. This would mean many foundries would be offering these modules and they would compete for customers based on price, quality, cycle times, etc. Also, it means that the entire manufacturing system can scale more easily with volume and still have sufficient redundancy, such that if any one foundry is unable to produce, a number of other foundries can be substituted relatively easily.

The present invention of process modules is analogous to other well-known techniques in manufacturing, specifically thee concept of "interchangeable parts," For example, if a designer was to build an automobile completely from custom designed and fabricated parts and components, the designer could strive to obtain optimally designed performance in that automobile, but this approach to development would come at enormous cost, time, and effort; thus, no designer would ever consider this approach. Alternatively, if the same designer were to use standardized parts (much akin to how almost everything is manufactured today), the auto could be designed and built much more quickly and at a comparatively lower cost. Thus, the business risk of such a venture would also be considerably lower and much more predictable. While the automobile designer may be required to give up some level of performance by use of standardized interchangeable parts and components, clearly the advantages of being able to get a product to market quickly and less expensively more than outweighs the small compromises in performance in most cases. A similar approach is employed in the development of software using high-level programming languages. Importantly, the distinction between the present invention and approaches based on products being implemented using the concept of interchangeable parts is that the present invention of employing process modules is based on employing individual process modules that can be combined to form custom process sequences whereas in interchangeable parts a product is can be made from a set of individual but identical parts.

Currently, the industry based on custom process sequences using micro- and nanofabrication technologies lacks a structured design methodology. To maximize innovation, a structured design methodology for implementation of devices is required. When device innovators have structured design paths to follow, the pace of innovation increases. The present invention of process modules enables such a structured design methodology and provides a quick and efficient pathway to development and manufacturing. This structured framework for structured design allows designers to make designs that are manufacturable from the start, thereby making it possible for device designers to minimize their product development expense and get products into the market sooner and at less cost.

This method of structured design relies heavily on the proposed process module techniques described in detail above and can be made into an automated design system, such as a computer-aided design (CAD) capability that makes it easy to build geometric designs concurrently with process sequences composed of process modules. The process modules themselves are proven, repeatable, reproducible, and statistically characterized, so that the devices constructed from these process modules will be designed for immediate manufacturability.

Preferably this structured design system would also include a geometric design rule checker. This will be similar to the Mead-Conway design rules for VLSI (i.e., integrated circuit design) which give designers information about the standard distances to use between design elements in the artwork and subsequent masks (FIG. 15). This diagram from the Mead-Conway text explains some of the design rules for nMOS, i.e., a MOSFET with an n-type channel. The standard VLSI rules govern distances in only the two dimensions of the substrate plane. Since many devices based on non-integrated circuit technologies are inherently three-dimensional, the present invention allows for design variability in the z direction. Preferably, this structured design system handles the special characteristics of 3-D designs and check design rules in all three dimensions. That is, the structured design system includes a geometric design rule checker, which provides standard minimal features, distances, and overlays in three dimensions for use in creating design elements in artwork and subsequent masks. The rule set will consist of global rules and rules that apply when specific process modules are used. The rules for process modules will be determined by statistical evaluation of the data collected as process modules are created.

Preferably, this structured design system works within standard web browsers, or other widely available commercial software, including those based on open standards. In particular, the new browser capabilities in HTML5 for client-driven raster and scalable vector graphics (SVG), along with the script-driven communication with the server that characterizes Web 2.0 applications, make it feasible to implement a structured design tool that runs on any personal computer or similar device that supports a standard web browser.

The new capabilities are all part of the HTML5 standard, which is supported by major browsers, including all of the capabilities that are essential to this new client-server CAD architecture. One of the important new capabilities of HTML5 (the next major revision of HTML (HyperText Markup Language)), is the CANVAS element, which allows client-side script programs to do draw arbitrary geometries on the screen. This will be important for many elements of the user interface of a CAD program. The CANVAS element is strictly limited, however, to raster-based graphics, in which drawing commands work directly with pixels. While all modern computer graphics are raster-based at the lowest level, a CAD tool of the type of the present invention really needs a higher-level vector-based graphics engine to provide a useful user experience. In vector-based graphics, the application software can avoid direct pixel management and work instead with a higher-level geometric model. The vector-graphics engine or library is implemented using high-performance native compilers and graphics hardware. This makes it possible to provide a sufficiently responsive user experience, even though the main application code relies on a slower, but more portable, programming language and virtual machine. Besides the new graphics capabilities, the new CAD software architecture will rely on Web 2.0 patterns, the client-side scripting and background communication with the server that is already used to provide the advanced behavior seen in sites such as Google's Gmail.

The present invention of process modules and structured design based on these process modules overcome many of the most important the challenges of device implementation and also have extremely broad utility and applicability and can be used in such emerging fields such as nanotechnology, photonics and heterogeneous integration. Certainly many technologies employing micro- and nano-fabrication techniques for the implementation of custom process sequences for device development and manufacturing share many common characteristics related to fabrication, including: they employ an extremely diverse set of processing techniques and materials; they rely on unique and customized sequences of steps to implement devices; and they aim to reduce the size of devices to the micro- and nano-miniaturized dimensional scales. In fact, nanotechnology has all of the same attributes of microtechnology, but the materials and processing space is even broader and more diverse. Similarly, photonics is a technology wherein the materials are very broad and there is not a standardized set of process technologies for the devices. In short, many technologies using micro- and/or nano-fabrication techniques will greatly benefit from a modularized process approach to implementation. Moreover, even high volume devices such as integrated circuits and microelectronics will also benefit from the present invention.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of fabricating Micro-Electro-Mechanical Systems (MEMS), Nano-Electro-Mechanical Systems (NEMS), Photonics, Nanotechnology, 3-Dimensional Integration, Micro- and Nano-Fabricated Devices and Systems, the method comprising:
providing a plurality of different standardized and repeatable process modules that are usable in fabricating a plurality of different types of said devices and systems,
defining a process sequence for fabricating a predefined one of said devices or systems,
identifying a plurality of the different process modules that are usable in performing at least a portion of the defined process sequence for fabricating the predefined device or system,
defining an ordered sequence for performing the identified plurality of the usable process modules, and
performing the identified usable sequence of process modules to perform at least a portion of the defined process sequence,
wherein the step of providing a plurality of different standardized and repeatable process modules usable in fabricating said devices and systems comprises the further step of identifying patterns in processing data collected from a plurality of actual process sequences used to fabricate said devices or systems and using those identifiable patterns to design appropriate process modules having utility for process sequences for the fabrication of a plurality of devices and systems.

2. The method of claim 1, wherein each provided process module is comprised of a plurality of processing steps, and wherein the number of processing steps comprising a provided process module can vary from one process module to another process module.

3. The method of claim 1, wherein each provided process module is comprised of a plurality of processing steps, and wherein the type of processing steps comprising a provided process module can vary from one process module to another process module.

4. The method of claim 1, wherein each provided process module is comprised of a plurality of processing steps, and wherein the ordering of processing steps comprising a provided process module can vary from one process module to another process module.

5. The method of claim 1, wherein the provided process modules include at least one process module for micromachining different types of polysilicon layers or polysilicon thin-film layers.

6. The method of claim 1, wherein the provided process modules include at least one process module for micromachining different types of metal layers or metal thin-film layers.

7. The method of claim 1, wherein the provided process modules include at least one process module for micromachining different types of dielectric layers or dielectric thin-film layers.

8. The method of claim 1, wherein the provided process modules include at least one process module for micromachining different types of polymer layers or polymer thin-film layers.

9. The method of claim 1, wherein the provided process modules include at least one process module for micromachining different types of ceramic layers or ceramic thin-film layers.

10. The method of claim 1, wherein the provided process modules include at least one process module for micromachining different types of bulk silicon.

11. The method of claim 1, wherein the provided process modules include at least one process module for micromachining different types of bulk substrates that can be composed of semiconductor, ceramic, metal, glass, polymer materials or any combination of materials therein including Silicon-On-Insulator (SOI).

12. The method of claim 10, wherein the provided process modules include at least one process module for micromachining different types of bulk silicon with different crystallographic orientations.

13. The method of claim 1, wherein the provided process modules include at least one process module for making through-wafer-vias or through-substrate vias.

14. The method of claim 1, wherein the step of providing a plurality of different standardized and repeatable process modules usable in fabricating said devices and systems comprises the further step of defining those process sequences usable for fabricating said devices or systems.

15. The method of claim 14, wherein the further step of defining those process sequences usable for fabricating said devices or systems comprises identifying process and design details for each process sequence run developed for said process sequences, including materials used, thicknesses of individual deposited layers, depths of etches, temperatures and chemistries of processing steps, types of processing steps, types of process modules, and an ordering of processing steps and process modules in each sequence.

16. The method of claim 15, wherein the step of identifying process and design details is performed using a software system.

17. The method of claim 15, wherein the identified process and design details are stored in a database for device design, modeling and subsequent access.

18. The method of claim 1, wherein the provided process modules include at least one process module that is a bulk micromachining process module for fabricating a multiplicity of different substrate shapes.

19. The method of claim 18, wherein the bulk micromachining process module uses wet chemical anisotropic etching.

20. The method of claim 19, wherein the bulk micromachining process module uses timed etch, dopant etch stop or electrochemical etch stops.

21. The method of claim 1, wherein the provided process modules include at least one process module for providing structural and sacrificial layers in any form of thin films or material layers that are commonly used in micro-fabrication and nano-fabrication.

22. The method of claim 1, wherein the provided process modules include at least one process module for micromachining any substrate type, shape, thickness or material type that are commonly used in micro-fabrication and nano-fabrication.

23. The method of claim 1, wherein the fabricating method is performed using distributed fabrication in which portions of the process sequence composed of one or more process modules, with or without individual processing steps that are not part of a process module, are used in fabricating a predefined device or system are performed at different foundries.

24. The method of claim 1, wherein the provided plurality of different standardized and repeatable process modules are usable with silicon wafers for a base substrate.

25. The method of claim 1, wherein the provided plurality of different standardized and repeatable process modules are usable with any substrate type, shape, thickness or material type that are commonly used in micro-fabrication and nano-fabrication.

26. The method of claim 1, wherein the substrate types with which the plurality of different standardized and repeatable process modules are usable include Silicon-On-Insulator (SOI) substrates, and substrates made of glasses, ceramics, and metals.

27. The method of claim 18, wherein the bulk micromachining process module uses etching that provides etched features with depth dimensions that encompass any depth of a wafer, including the entire wafer thickness to less than one micron, and lateral dimensions ranging from less than one micron to over one millimeter.

28. The method of claim 1, wherein the provided plurality of different standardized and repeatable process modules encompass any material as a masking layer material and any method of patterning and etching to expose a substrate to an etching solution.

29. The method of claim 1, wherein the provided plurality of different standardized and repeatable process modules encompass any material as a structural layer material and any method of patterning and etching to pattern the structural layer into the desired design.

30. The method of claim 1, wherein the provided plurality of different standardized and repeatable process modules encompass any material as a sacrificial layer material and any method of patterning and etching to pattern the sacrificial layer into the desired design.

31. The method of claim 28, wherein the masking materials include thermally grown $SiO_2$, Silicon Nitride, polymers; and metals including Ta, Au, Cr, Ag, Cu and Al.

32. The method of claim 18, wherein the bulk micromachining process module uses wet isotropic etching, gas isotropic etching, and reactive ion etching, including Deep Reactive Ion Etching (DRIE).

33. The method of claim 1, wherein the provided process modules include at least one process module for wafer bonding, in which two or more wafers are joined together to create a multi-wafer stack.

34. The method of claim 1, wherein the provided process modules include at least one process module for laser micromachining, in which a laser generate an intense amount of the energy in a very short pulse of light and directs the energy onto a selected region of material.

35. The method of claim 34, wherein the laser micromachining is performed using a CO2, YAG, or excimer laser.

36. The method of claim 34, wherein the laser micromachining is performed using a femto-second laser.

37. The method of claim 1, wherein the provided process modules include at least one process module for providing through-wafer or through-substrate vias.

38. The method of claim 1, wherein includes process modules using Lithographie Galvanoformung Adformung (LIGA) for fabricating high-aspect-ratio microstructures, high-aspect ratio polymer and plating processes, and plastic replication processes, including molding and embossing.

39. The method of claim 1, wherein the step of defining a process sequence for fabricating a predefined one of said devices or systems comprises using a structured design system that includes a geometric design rule checker, which provides standard minimal features, distances, and overlays in three dimensions for use in creating design elements in artwork and subsequent masks.

40. The method of claim 39, wherein the geometric design rule checker consists of global rules and rules that apply when specific process modules are used, the rules for modules being determined by statistical evaluation of data collected as modules are created.

41. The method of claim 39, wherein the structured design system is usable within standard web browsers and commercially available software, including software based on open standards.

42. The method of claim 41, wherein the standard web browsers include browsers including browser capabilities in HTML5 for client-driven raster and scalable vector graphics (SVG), along with the script-driven communication with a server that characterizes Web 2.0 applications, wherein the structured design system operates on personal computers or similar devices that support a standard web browser.

43. The method of claim 1, wherein the method further comprises performing additional process steps required to complete the defined process sequence.

44. The method of claim 1, wherein the standardized processing modules are analogues to process building blocks.

45. The method of claim 1, wherein the number, type and ordering of processing steps comprising a process module varies according to the complexity of the process module.

46. A method of fabricating Micro-Electro-Mechanical Systems (MEMS), Nano-Electro-Mechanical Systems (NEMS), Photonics, Nanotechnology, 3-Dimensional Integration, Micro- and Nano-Fabricated Devices and Systems, the method comprising:

providing a plurality of different standardized and repeatable process modules usable in fabricating a plurality of different types of said devices and systems, each process module being comprised of a plurality of processing steps, the standardized and repeatable process modules including at least one process module for micromachining different types of wafer surfaces, at least one process module for making through wafer vias, and at least one process module for bulk micromachining of substrates, defining a process sequence for fabricating a predefined one of said devices or systems, identifying a plurality of the different process modules that are usable in performing at least a portion of the defined process sequence for fabricating the predefined device or system, defining an ordered sequence for performing the identified plurality of the usable process modules, and performing the identified sequence of usable process modules to perform the portion of the defined process sequence, wherein the step of providing a plurality of different standardized and repeatable process modules usable in fabricating said devices and systems comprises the further step of identifying patterns in processing data collected from a plurality of actual process sequences used to fabricate said devices or systems and using those identifiable patterns to design appropriate process modules having utility for process sequences for the fabrication of a plurality of devices and systems.

47. The method of claim 46, wherein the number of processing steps comprising a process module varies according to the complexity of the process module.

48. The method of claim 46, wherein the type of processing steps comprising a process module varies according to the complexity of the process module.

49. The method of claim 46, wherein the ordering of processing steps comprising a process module varies according to the complexity of the process module.

50. The method of claim 46, wherein the method further comprises performing additional process steps required to complete the defined process sequence.

51. A method of fabricating Micro-Electro-Mechanical Systems (MEMS), Nano-Electro-Mechanical Systems (NEMS), Photonics, Nanotechnology, 3-Dimensional Integration, Micro- and Nano-Fabricated Devices and Systems, the method comprising:

providing a plurality of different standardized and repeatable process modules usable in fabricating a plurality of different types of said devices and systems, each process module being comprised of a plurality of processing steps which vary according to the complexity of the process module, the standardized and repeatable process modules including at least one process module for micromachining different types of wafer surfaces, at least one process module for making through wafer vias, and at least one process module for bulk micromachining of substrates, defining a process sequence for fabricating a predefined one of said devices or systems, identifying a plurality of the different process modules that are usable in performing at least a portion of the defined process sequence for fabricating the predefined device or system, defining an ordered sequence for performing the identified plurality of the usable process modules, performing the identified sequence of usable process modules to perform the portion of the defined process sequence, and if necessary, performing additional process steps required to complete the defined process sequence, wherein the step of providing a plurality of different standardized and repeatable process modules usable in fabricating said devices and systems comprises the further step of identifying patterns in processing data collected from a plurality of actual process sequences used to fabricate said devices or systems and using those identifiable patterns to design appropriate process modules having utility for process sequences for the fabrication of a plurality of devices and systems.

52. A method of fabricating Micro-Electro-Mechanical Systems (MEMS), Nano-Electro-Mechanical Systems (NEMS), Photonics, Nanotechnology, 3-Dimensional Integration, Micro- and Nano-Fabricated Devices and Systems, the method comprising:

providing a plurality of different standardized and repeatable process modules usable in fabricating a plurality of different types of said devices and systems, each process module being comprised of a plurality of processing steps, the standardized and repeatable process modules including at least one process module for surface micromachining different types of structural and sacrificial layers, defining a process sequence for fabricating a predefined one of said devices or systems, identifying a plurality of the different process modules that are usable in performing at least a portion of the defined process sequence for fabricating the predefined device or system, defining an ordered sequence for performing the identified plurality of the usable process modules, and performing the identified sequence of usable process modules to perform the portion of the defined process sequence, wherein the step of providing a plurality of different standardized and repeatable process modules usable in fabricating said devices and systems comprises the further step of identifying patterns in processing data collected from a plurality of actual process sequences used to fabricate said devices or systems and using those identifiable patterns to design appropriate process modules having utility for process sequences for the fabrication of a plurality of devices and systems.

53. A method of fabricating Micro-Electro-Mechanical Systems (MEMS), Nano-Electro-Mechanical Systems (NEMS), Photonics, Nanotechnology, 3-Dimensional Integration, Micro- and Nano-Fabricated Devices and Systems, the method comprising:

providing a plurality of different standardized and repeatable process modules usable in fabricating a plurality of different types of said devices and systems, each process module being comprised of a plurality of processing steps, the standardized and repeatable process modules including at least one process module for surface micromachining different types of structural and sacrificial layers and at least one process module for bulk micromachining of substrates, defining a process sequence for fabricating a predefined one of said devices or systems, identifying a plurality of the different process modules that are usable in performing at least a portion of the defined process sequence for fabricating the predefined device or system, defining an ordered sequence for performing the identified plurality of the usable process modules, and performing the identified sequence of usable process modules to perform the portion of the defined process sequence, wherein the step of providing a plurality of different standardized and repeatable process modules usable in fabricating said devices and systems comprises the further step of identifying patterns in processing data collected from a plurality of actual process sequences used to fabricate said devices or systems and using those identifiable patterns to design appropriate process modules having utility for process sequences for the fabrication of a plurality of devices and systems.

* * * * *